United States Patent [19]
Inoue et al.

[11] Patent Number: 5,506,428
[45] Date of Patent: Apr. 9, 1996

[54] GATE ARRAY LSI

[75] Inventors: Toru Inoue; Michihiro Amiya; Tadao Takahashi, all of Tokyo, Japan

[73] Assignee: Oki Electric Industry Co., Ltd., Tokyo, Japan

[21] Appl. No.: 281,457

[22] Filed: Jul. 27, 1994

[30] Foreign Application Priority Data

Aug. 13, 1993  [JP]  Japan .................. 5-201566

[51] Int. Cl.$^6$ .................................. H01L 27/10
[52] U.S. Cl. ........................... 257/208; 257/207
[58] Field of Search ........................ 257/203, 207, 257/208

[56] References Cited

FOREIGN PATENT DOCUMENTS

| | | |
|---|---|---|
| 4327652 | 3/1994 | Germany . |
| 61-230359 | 10/1986 | Japan .................. 257/208 |
| 1-27240 | 1/1989 | Japan .................. 257/208 |
| 2-51252 | 2/1990 | Japan .................. 257/208 |
| 3-69163 | 3/1991 | Japan . |
| 2134708 | 8/1984 | United Kingdom . |

OTHER PUBLICATIONS

Patent Abstracts of Japan, vol. 14, No. 216 (E–9024) May 8, 1990 & JP–A–02 051 252 (Toshiba Corp.) Feb. 21, 1990.

*Primary Examiner*—Stephen D. Meier
*Attorney, Agent, or Firm*—Frishauf, Holtz, Goodman, Langer & Chick

[57] ABSTRACT

A gate array LSI having functional blocks formed by interconnecting a plurality of basic cells arranged on a semiconductor substrate in matrix form and either signal conductive patterns or first power conductive patterns. According to the gate array LSI, the first power conductive patterns are disposed on the plurality of basic cells arranged in line and are divided and disposed on the basic cells so as to interpose the signal conductive pattern therebetween. It is therefore possible to improve the efficiency of wiring macrocells.

4 Claims, 2 Drawing Sheets

GATE ARRAY LSI

BACKGROUND OF THE INVENTION

1. Field of the Invention

This invention relates to a semiconductor integrated circuit, and particularly to a gate array LSI.

2. Description of the Related Art

As a conventional gate array LSI, there is known one disclosed in Japanese Patent Application Laid-Open Publication No. 3-69163. The gate array LSI is one of a type that a plurality of basic cells each comprised of an NMOSFET having an N-type diffused region and a PMOSFET having a P-type diffused region are arranged in matrix form. Further, the gate array LSI is provided with a dedicated signal conductive pattern or conductor used for a clock signal and a test facilitation circuit. The dedicated signal conductor is used to suppress or control a reduction in performance of the clock signal and facilitate a test. A functional block such as a NAND circuit, an OR circuit or the like has been constructed by interconnecting the dedicated signal conductor, basic cells and a plurality of macrocells corresponding to wiring patterns with each other.

In the basic cells for the gate array LSI, basic cell patterns fabricated on a semiconductor substrate in advance and patterns for the signal conductor and a power conductive pattern or conductor have no symmetry in directions vertical and horizontal to the semiconductor substrate. It has thus been desirable to improve the efficiency of wiring the macrocells of the same patterns.

SUMMARY OF THE INVENTION

It is an object of the present invention to provide a gate array LSI capable of improving the efficiency of wiring macrocells.

The present application discloses other various inventions made to achieve the above object. These inventions will be understood from the appended claims, the following embodiment and the accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

Figure 1:
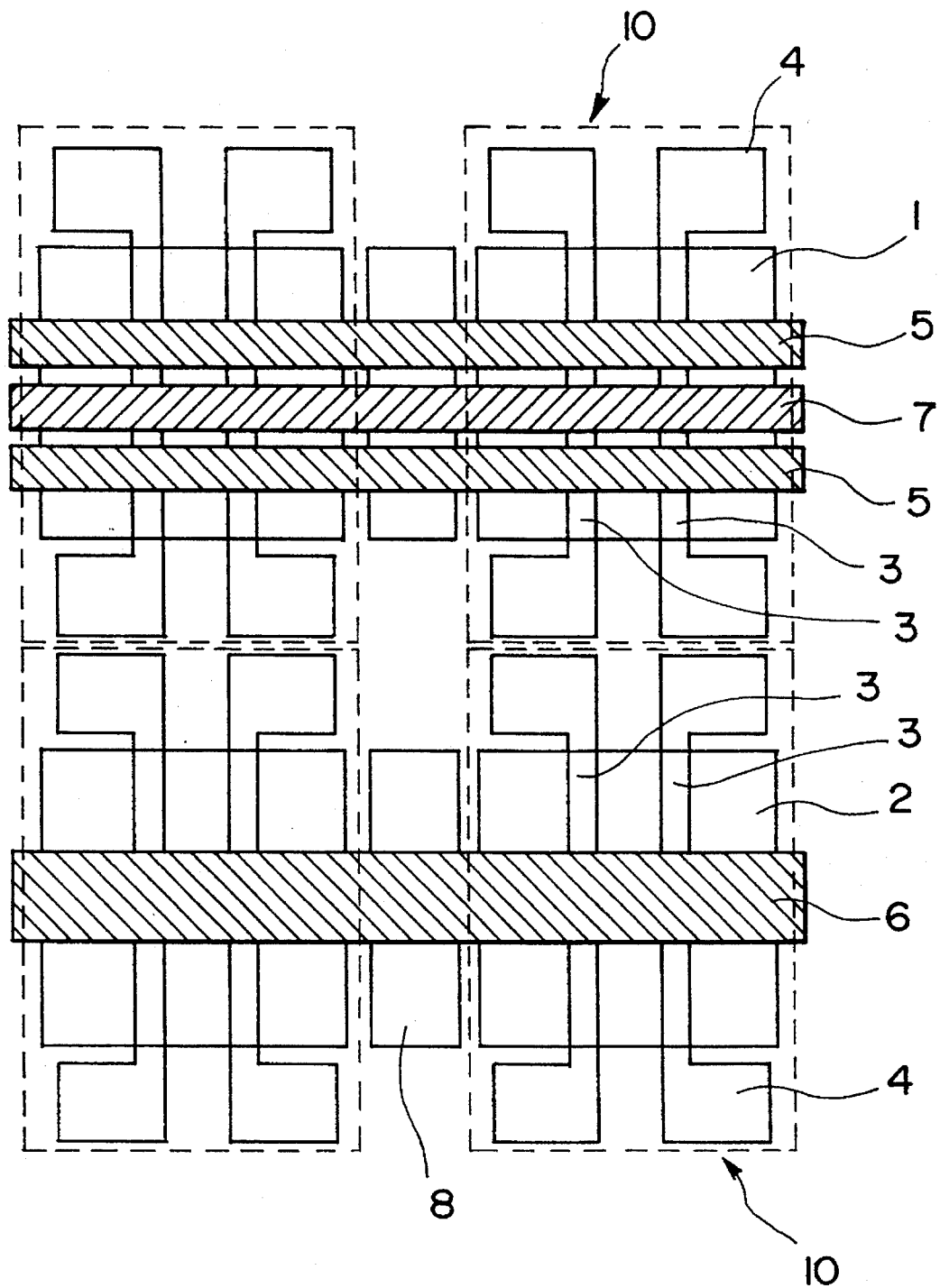
FIG. 1 is a plan view showing basic cells which form a gate array LSI according to the present invention.

A preferred embodiment of the present invention will hereinafter be described with reference to the accompanying drawings. FIG. 1 is a plan view illustrating basic cells which form a gate array LSI of the present invention.

In FIG. 1, reference numeral 1 indicates a first diffused region of a first conduction type (N type, for example), which is fabricated on the surface of an unillustrated semiconductor substrate (such as a silicon substrate). Reference numeral 2 indicates a second diffused region of a second conduction type (P type, for example). Reference numeral 3 indicates each of gate electrodes, which is composed of polysilicon or the like. Reference numeral 4 indicates each of gate connection regions, which provide electrical connections between the gate electrodes 3 and other signal conductive patterns or conductors or the like. A single basic cell 10 comprises the first diffused region 1 or the second diffused region 2, the two gate electrodes 3 and the two gate connection regions 4. The basic cell 10 is comprised of two series-connected FETs. Reference numeral 5 indicates each of first power conductive patterns or conductors used for the supply of a ground potential, which extends in a horizontal direction as seen in FIG. 1 and is disposed above the first diffused region 1 and the gate electrodes 3. The first power conductors comprise parallel-arranged conductors divided into two lines. Further, reference numeral 6 indicates a second power conductive pattern or conductor for the supply of a high potential (5 V or the like, for example), which extends in the horizontal direction as viewed in FIG. 1 and is disposed above the second diffused region 2 and the gate electrodes 3. The second power conductor 6 is disposed in a substantially central position of a region where the second diffused region 2 and the gate electrodes 3 are provided. Furthermore, reference numeral 7 indicates a dedicated signal conductive pattern or conductor provided for a clock signal and a test facilitation circuit, which is disposed in a position where it is interposed between the two first power conductors 5 and is provided substantially parallel with the first power conductors 5. Reference numeral 8 indicates each of substrate electrodes fabricated on the surface of the semiconductor substrate to maintain the semiconductor substrate at a predetermined potential. The substrate electrode 8 comprises the semiconductor substrate or a high-density layer of a conduction type identical to a well region formed within the semiconductor substrate.

In the illustrated embodiment, an unillustrated insulative film is interposed between the first diffused region 1, the second diffused region 2 and the gate electrodes 3, and the first power conductors 5, the second power conductor 6 and the signal conductor 7. Further, the two divided first power conductors 5 are electrically connected to a common potential (ground potential) through the insulative film at at least one point. The width of the first power conductor 5 may be substantially half that of the single second power conductor 6. Since the signal conductor 7 is not provided on the second diffused region 2 in advance, the second power conductor 6 is disposed on the center portion of the second diffused region 2 so as to have, on the second diffused region 2, a layout pattern symmetric with respect to the horizontal and vertical directions as seen on the semiconductor substrate (FIG. 1). Similarly, the two first power conductors 5 substantially parallel to the signal conductor 7 formed in the center of the first diffused region 1 are provided on the first diffused region 1 with the signal conductor 7 interposed therebetween to thereby create the symmetry of layout patterns or symmetrical layout patterns. In order to make the symmetry of the layout patterns, the distances between the signal conductor 7 and one of the two first power conductors 5 and between the signal conductor 7 and the other first power conductor 5 may be set so as to become equal to each other. In the present embodiment, the thicknesses of the first power conductor 5, the second power conductor 6 and the signal conductor 7 and the interval between each first power conductor 5 and the signal conductor 7 are respectively 2.8 μm, 2.4 μm, 6.8 μm and 1.4 μm. As shown in FIG. 1, the first power conductors 5, the second power conductor 6 and the signal conductor 7 are disposed over a plurality of basic cells arranged in the horizontal direction as seen in FIG. 1. Namely, the gate array LSI according to the present embodiment is constructed in such a manner that a plurality of basic cells 10 comprised of FETs that are active elements having the same patterns, are provided on the semiconductor substrate in matrix form and the first power conductors 5 divided into the two lines and the signal conductor 7 are provided on their corresponding basic cells 10 whereas the second power conductor 6 is provided on its corresponding basic cells 10.

Figure 2:
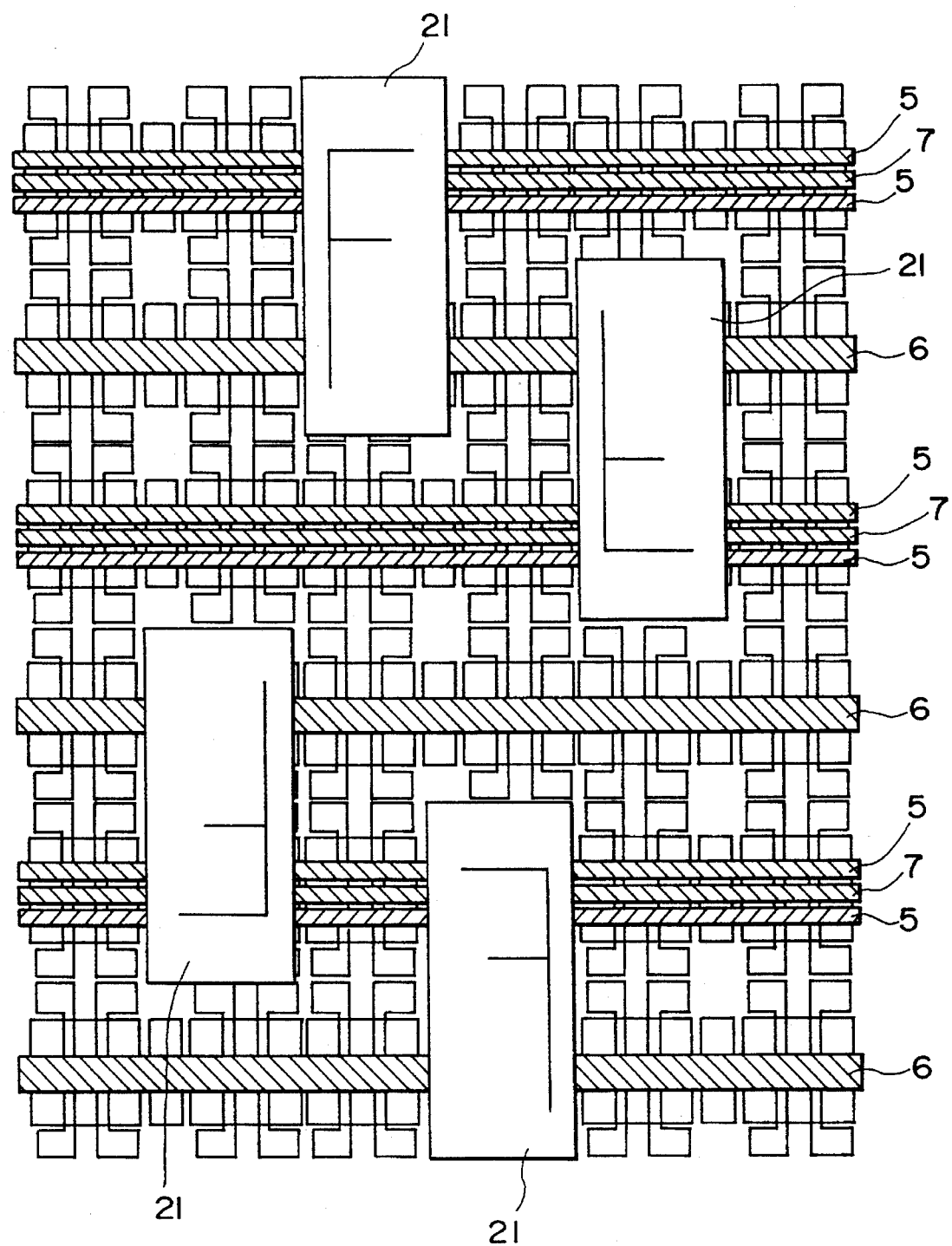
FIG. 2 is a plan view illustrating a layout pattern of the gate array LSI shown in FIG. 1, wherein the basic cells shown in FIG. 1 are arranged in matrix form.

The relationship between the directivity of a macropattern and each basic cell shown in FIG. 1 will now be described below with reference to FIG. 2. FIG. 2 is a plan view showing a layout pattern of the gate array LSI in which the basic cells shown in FIG. 1 have been arranged in matrix form. The same elements of structure as those shown in FIG. 1 are identified by the same reference numerals.

In FIG. 2, reference numeral 21 indicates each of typically-shown macrocells for respectively forming functional blocks by electrically interconnecting the gate connection regions 4 and the like and the signal conductors 7 and the like provided on the basic cells. The four macrocells shown in FIG. 2 respectively have the same wiring patterns. A symbol 「F」 marked on each macrocell 21 shows the direction of the macrocell 21, i.e., the direction of the same wiring pattern. The macrocell 21 is formed as a layer identical to other conductor or an upper layer conductor. The wiring width of each macrocell 21 is set so as to be narrower than that of each of the second power conductor 6 and the signal conductor 7. The macrocell 21 forms a functional block obtained by establishing direct electrical connections between the signal conductor 7, the first power conductors 5, etc. and the gate connection regions 4, the first diffused regions 1, etc.

As shown in FIG. 2, the gate connection regions 4 and the like are provided as symmetrical patterns in such a manner that the signal conductor 7 and the second power conductor 6 respectively centrally provided on the first diffused region 1 and the second diffused region 2 are taken as the centers respectively. Thus, in order to create the same functional blocks, the same macropatterns 21 may be used so as to form four layouts or arrangements. According to the present embodiment as well, the patterns can be symmetrically set even from any basic cell because the two first power conductors 5 and the second power conductor 6 are alternately disposed on the plurality of basic cells. It is therefore possible to improve the efficiency of laying out the macrocells 21.

Since the signal conductor 7 is interposed between the two first power conductors 5 each having a predetermined potential, an influence exerted over other signal by coupling noise can be reduced and a stable signal can be transmitted. Further, according to the present embodiment, the first power conductors 5 divided into the two lines and the substrate electrode 8 can be connected to one another at two intersections.

The present invention is not necessarily limited to or by the preset embodiment. A potential to be supplied through each of the two divided first power conductors 5 may be a power supply potential (5 V), for example. The number of the first power conductors 5 may be two or more. In this case, the number of the first power conductors to be divided must be an even number. Further, the same number of first power conductors must be provided on both side of the signal conductor 7.

Having now fully described the invention, it will be apparent to those skilled in the art that many changes and modifications can be made without departing from the spirit or scope of the invention as set forth herein.

What is claimed is:

1. A gate array LSI having a semiconductor substrate on which a plurality of basic cells are arranged in a matrix, comprising:

a signal conductor disposed so as to set at least one of the plurality of basic cells to be symmetrical in relation to said signal conductor;

two first power conductors for supplying a first potential, and a second power conductor for supplying a second potential, said two first power conductors being disposed symmetrically on opposite sides of said signal conductor wherein respective macrocells having the same macropattern have to connect adjacent ones of the plurality of basic cells to each other; and wherein said second power conductor is divided into two lines, said signal conductor being interposed between and parallel to said two lines.

2. A gate array LSI according to claim 1, wherein a width of said two lines is narrower than a width of said first power conductor.

3. A gate array LSI comprising:

a first power conductor for supplying a first potential, a first signal conductor, a second signal conductor and two second power conductors, said first power conductor and said first and second signal conductors being arranged on a semiconductor substrate on which a plurality of basic cells are arranged in a matrix, the first power conductor being disposed so as to set at least one of the plurality of basic cells to be symmetrical in relation to the first power conductor, the first and second signal conductors being disposed symmetrically on opposite sides of the first power conductor, wherein respective macrocells the same macropattern have to connect adjacent ones of the plurality of basic cells to each other;

each of said two second power conductors being divided into two lines, said first signal conductor being interposed between and parallel to two lines corresponding to one of said two power conductors, and said second signal conductor being interposed between and parallel to two lines corresponding to another of said two power conductors.

4. A gate array LSI according to claim 3, wherein a width of said two lines forming each of said two second power conductors is narrower than a width of said first power conductor.

* * * * *

UNITED STATES PATENT AND TRADEMARK OFFICE
CERTIFICATE OF CORRECTION

PATENT NO. : 5,506,428
DATED : April 9, 1996
INVENTOR(S) : Inoue et al.

It is certified that error appears in the above-indentified patent and that said Letters Patent is hereby corrected as shown below:

Column 4, line 46 (claim 3), after "macrocells" insert --have--; after "macropattern" delete "have";

line 48 (claim 3), after "other;" insert --and--.

Signed and Sealed this

Fourth Day of February, 1997

Attest:

BRUCE LEHMAN

*Attesting Officer*     *Commissioner of Patents and Trademarks*